(12) United States Patent
Shibata (10) Patent No.: US 7,119,347 B2
(45) Date of Patent: Oct. 10, 2006

(54) ION IMPLANTATION APPARATUS AND METHOD

(75) Inventor: Takeshi Shibata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 11/088,881

(22) Filed: Mar. 25, 2005

(65) Prior Publication Data

US 2005/0218345 A1   Oct. 6, 2005

(30) Foreign Application Priority Data

Mar. 26, 2004   (JP)   .............................. 2004-092352

(51) Int. Cl.
  *G21K 5/10*   (2006.01)
  *G01R 31/28*   (2006.01)
(52) U.S. Cl. .................. 250/492.21; 324/752; 324/765
(58) Field of Classification Search ........... 250/492.21, 250/492.2, 492.3
  See application file for complete search history.

(56) References Cited

U.S. PATENT DOCUMENTS 5,883,518 A * 3/1999 Borden ........................ 324/752
6,009,064 A * 12/1999 Hajjar .................... 369/112.24
6,111,840 A * 8/2000 Hajjar .................... 369/112.02
6,541,759 B1 * 4/2003 Hill ........................ 250/227.27
6,906,801 B1 * 6/2005 Borden et al. .............. 356/432
2003/0123153 A1 * 7/2003 Ohtomo et al. ............. 359/618
2004/0053143 A1 * 3/2004 Sandstrom ..................... 430/5
2004/0159787 A1 * 8/2004 Nakasuji et al. ............ 250/311
2004/0174514 A1 * 9/2004 Kawahara .................... 355/72

FOREIGN PATENT DOCUMENTS

JP    06-325723 A2    11/1994

* cited by examiner

*Primary Examiner*—Nikita Wells
*Assistant Examiner*—Johnnie L Smith, II
(74) *Attorney, Agent, or Firm*—Finnegan, Henderson, Farabow, Garrett & Dunner, L.L.P.

(57) ABSTRACT

An ion implantation apparatus includes a laser beam irradiation unit which irradiates the surface of a target substrate with laser beam. The angle of an optical axis of the laser beam relative to the surface is adjustable. A reference line defining unit is adapted to define a virtual reference line which coincides with the optical axis of the laser beam when the angle takes a certain value. An ion irradiation unit provides an ion beam on a trajectory which coincides with the reference line.

14 Claims, 7 Drawing Sheets

ION IMPLANTATION APPARATUS AND METHOD

CROSS-REFERENCE TO RELATED APPLICATIONS

This application is based upon and claims the benefit of priority from prior Japanese Patent Application No. 2004-092352, filed Mar. 26, 2004, the entire contents of which are incorporated herein by reference.

BACKGROUND OF THE INVENTION

1. Field of the Invention

The present invention relates to an ion implantation apparatus and method.

2. Description of the Related Art

In the process of manufacturing semiconductor devices, ion implantation carried out to introduce impurities into the semiconductor substrate is affected by a phenomenon called channeling. Channeling is a phenomenon in which, when the direction in which an ion beam impinges at the semiconductor substrate coincides with the crystal orientation of the semiconductor substrate, many impurities reach deeper than the position of a peak value of the impurity profile obtained when the ion implantation direction does not coincide with the crystal orientation. The magnitude of channeling depends on the angle at which ions are implanted into the semiconductor substrate (perpendicularity); therefore, the characteristics of a semiconductor device formed on the semiconductor substrate vary according to the perpendicularity. Accordingly, control of the perpendicularity is important.

At present, however, the accuracy of the angle between the trajectory of the ion beam and the processed surface of the semiconductor substrate, which is involved in the determination of perpendicularity, depends on the mechanical precision of the ion implantation apparatus. In other words, the ion implantation apparatus is not configured so as to observe the relative relationship between the trajectory of the ion beam and the processed surface of the semiconductor substrate and control the perpendicularity accordingly. That is, in general, a plumb and a level are used to find a perpendicular and a parallel plane relative to the direction of gravity for use as reference lines and an ion implantation apparatus is assembled with reference to these reference lines. For this reason, the reference lines vary according to the accuracy to which parts of the ion implantation apparatus are processed and the accuracy to which these parts are assembled. As the result, the perpendicularity varies from apparatus to apparatus.

Some ion implantation apparatus have function to measure the trajectory of the ion beam and adjust it. The apparatus, however, measures only the trajectory to a measuring instrument and does not measure the angle between the measuring instrument and the substrate. As a result, it cannot detect the change of the angle between the measuring instrument and the substrate. This leads failure to detect possible change of the angle between the trajectory of the ion beam and the substrate.

As described above, at present, the relative relationship between the trajectory of an actual ion beam and the processed surface of a semiconductor substrate is not observed. For this reason, even if, its condition changes due to some factors and consequently the perpendicularity changes after an ion implantation apparatus has been assembled, it is impossible to notice and correct this situation. From the same reason, it is impossible to detect variations in perpendicularity from substrate to substrate, which can produce variations in device performance.

BRIEF SUMMARY OF THE INVENTION

According to a first aspect of the present invention, there is provided an ion implantation apparatus comprising: a laser beam irradiation unit irradiating a surface of a target substrate with laser beam, an angle of an optical axis of the laser beam relative to the surface being adjustable; a reference line defining unit adapted to define a virtual reference line coinciding with the optical axis of the laser beam when the angle takes a certain value; and an ion irradiation unit providing an ion beam on a trajectory coinciding with the reference line.

According to a second aspect of the present invention, there is provided an ion implantation apparatus comprising: an ion irradiation unit irradiating a surface of a target substrate with an ion beam, an angle of a trajectory of the ion beam relative to the surface being adjustable; a reference line defining unit adapted to define a virtual reference line coinciding with the trajectory of the ion beam when the angle takes a certain value; and a substrate holding unit holding the target substrate and changing an inclination of the surface relative to the reference line to change the angle.

According to a third aspect of the present invention, there is provided an ion implantation method comprising: defining a virtual reference line coinciding with an optical axis of laser beam directed onto a surface of a target substrate when an angle of the optical axis relative to the surface is a certain value; and irradiating the surface with an ion beam on a trajectory which coincides with the defined reference line.

According to a fourth aspect of the present invention, there is provided an ion implantation method comprising: defining a virtual reference line, the reference line coinciding with a set trajectory of an ion beam emitted toward a virtual plane when an angle of the ion beam relative to the virtual plane becomes a certain value, a surface of a target substrate being to be positioned at the virtual plane; adjusting an angle of the surface relative to an optical axis of laser beam the trajectory of which coincides with the defined reference line; and irradiating the adjusted surface with the ion beam on the set trajectory.

DETAILED DESCRIPTION OF THE INVENTION

The embodiments of the present invention will be described hereinafter with reference to the accompanying drawings. In the description which follows, components which have substantially the same functions and arrangements are denoted by like reference numerals and repeated descriptions thereof will be given only when necessary.

[First Embodiment]

Figure 1:
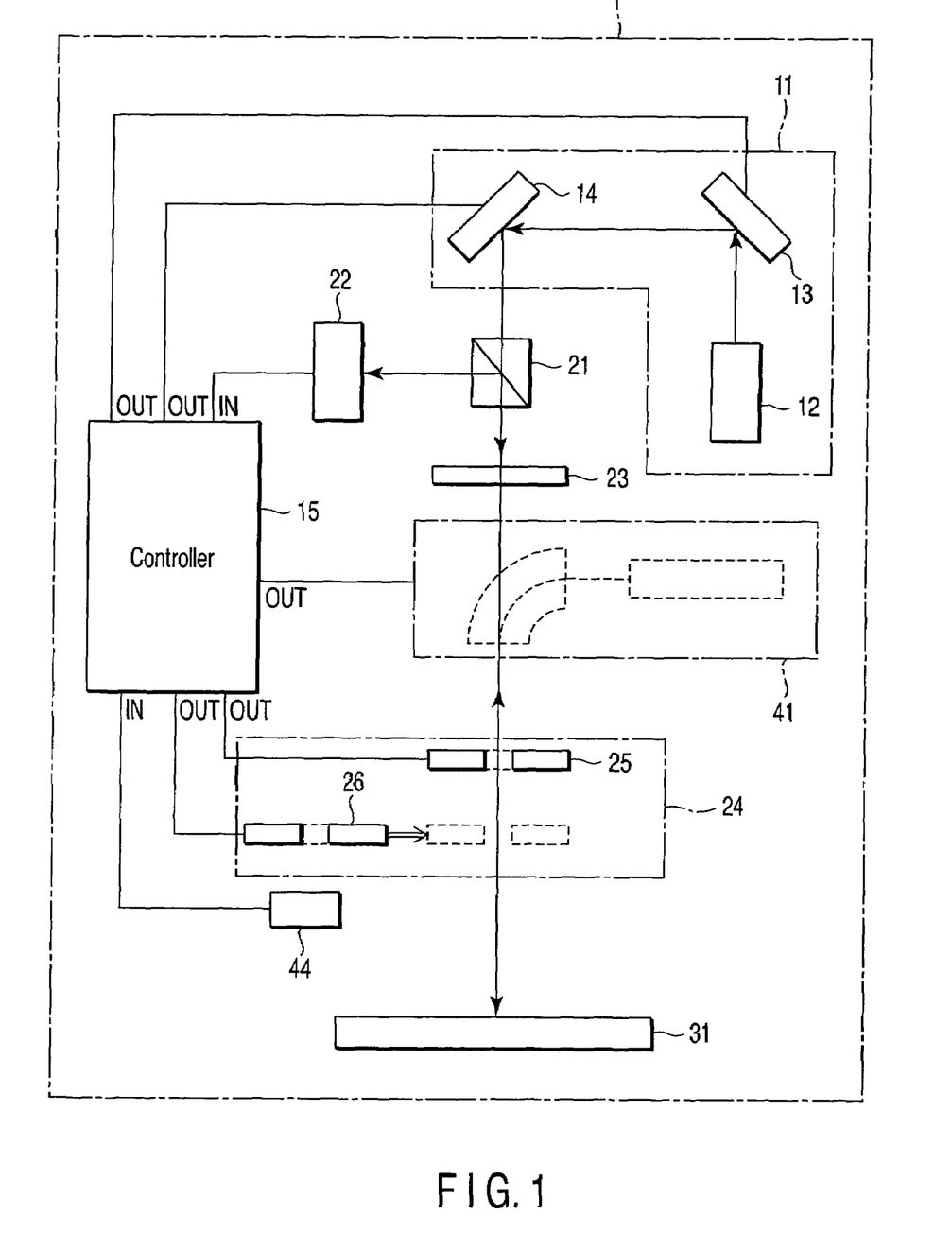
FIG. 1 shows one state of the main portion of an ion implantation apparatus according to a first embodiment of the present invention.

FIG. 1 schematically shows one state of the main portion of an ion implantation apparatus, indicated generally by 1, according to a first embodiment of the present invention. More specifically, FIG. 1 shows the state of the ion implantation apparatus 1 when the perpendicularity with respect to a target substrate 31 is set, as will be described in detail later. As shown in FIG. 1, the ion implantation apparatus has a laser beam irradiation unit 11. The laser beam irradiation unit 11 emits laser beam used to adjust the angle at which a beam of ions impinges on the target substrate 31. The laser beam irradiation unit 11 has a laser beam source 12 and mirrors 13 and 14.

The mirrors 13 and 14 are placed between the laser emitting port of the laser beam source 12 and the target substrate 31. The mirrors 13 and 14 can move and conduct the laser beam onto the target substrate 31 and adjusting its optical axis. With two movable mirrors for conducting the laser beam emitted from the laser beam source 12 onto the target substrate 31, the optical axis of the laser beam can be adjusted freely within the range of the size of the mirrors. A controller 15 controls the inclination of each of the mirrors 13 and 14. Only one or more than two mirrors in the laser beam irradiation unit 11 is possible.

Between the mirror 13 and the target substrate 31 is placed a polarized beam splitter 21. The polarized beam splitter 21 is an optical device and transmits about 100% of P component of the laser (except absorbed light) and reflects about 100% of S component of the laser. Consequently, transmitted light is converted into a linearly polarized light.

A quarter-wave plate 23 is provided between the polarized beam splitter 21 and the target substrate 31. The quarter-wave plate 23 converts linear polarization into circular polarization or vice versa, if an optical axis is suitable. The utilization of such a property allows the polarization direction of light which passes through the quarter-wave plate 23 and is then reflected by the target substrate 31 to be rotated through 90 degrees. Consequently, the light reflected by the target substrate 31 is converted to S polarized light for the beam splitter 21 and is reflected by the beam splitter 21.

A light intensity measurer 22 is provided at the side of the polarized beam splitter 21. The light intensity measurer 22 is positioned to receive laser beam which is first reflected by the target substrate 31 and then reflected by the polarized beam splitter 21. The light intensity measurer 22 is adapted to measure the intensity of incident light and supply the measurements to the controller 15.

A reference line defining unit 24 is provided between the quarter-wave plate 23 and the target substrate 31. The reference line defining unit 24 grasps the optical axis of the laser beam and define a virtual reference line identical to the optical axis. In adjusting the trajectory of the ion beam, this virtual reference line is used. The reference line defining unit 24 has a first aperture plate 25 and a second aperture plate 26 which are placed in sequence. Each of the first aperture 25 and the second aperture plates 26 has an aperture and can move under the control of the controller 15. An ion irradiation unit 41 and an ion measuring instrument 44 will be described later.

Figure 2:
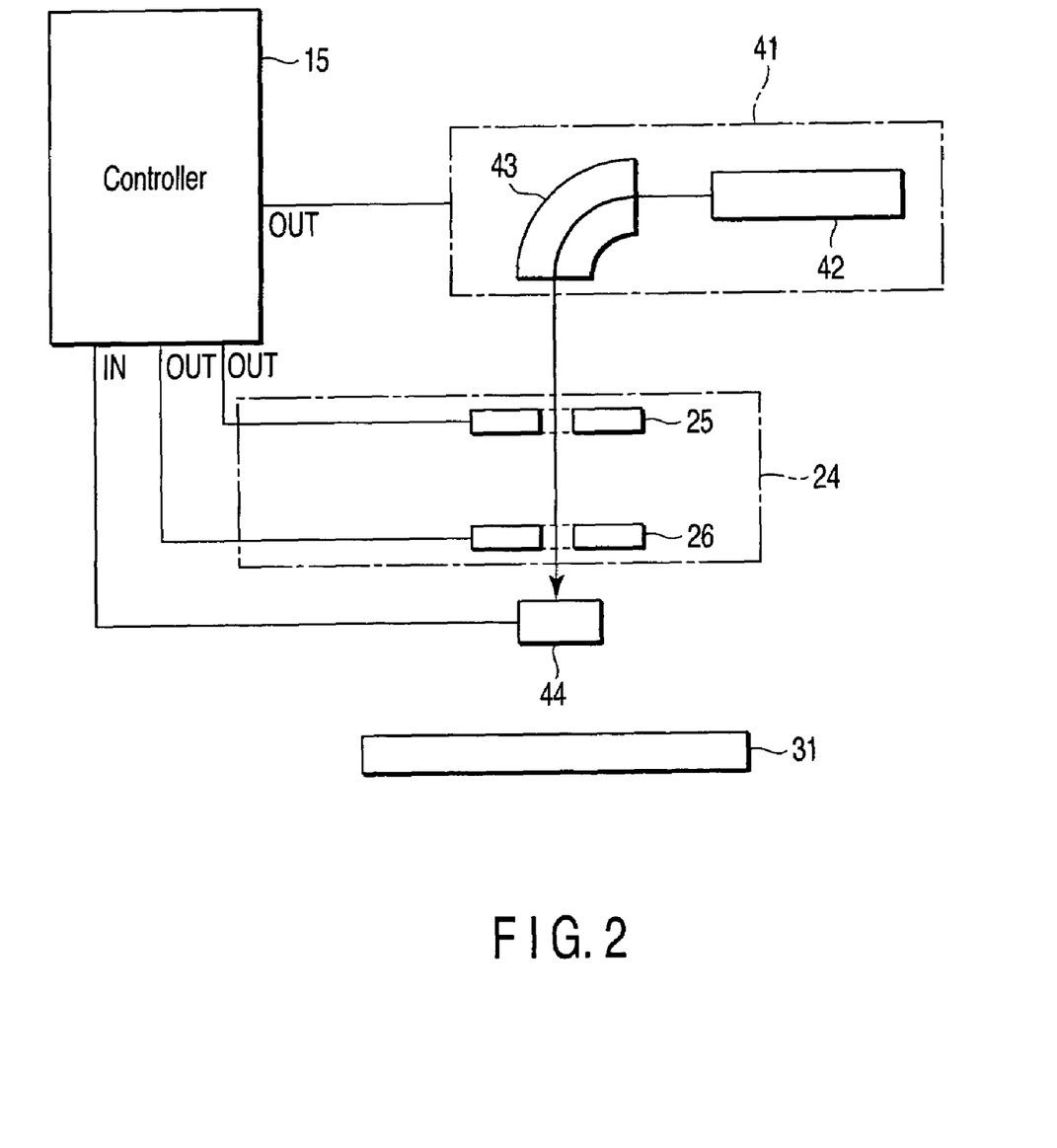
FIG. 2 shows one state of the main portion of the ion implantation apparatus according to the first embodiment of the present invention.

FIG. 2 schematically shows another state of the main portion of the ion implantation apparatus according to the first embodiment. As will be described later, FIG. 2 shows the state when the trajectory of the ion beam is adjusted. As shown in FIG. 2, the ion irradiation unit 41 is placed over the first aperture plate 25 and emits a beam of ions to be implanted into the target substrate 31. The ion irradiation unit 41 can arbitrarily set the angle of the ion beam relative to the target substrate 31.

The ion irradiation unit 41 has an ion beam generator 42 and a collimator magnet 43. The ion beam generator 42 includes a source of ions, an analyzer magnet, and a scanner and emits ions toward the entrance of the collimator magnet 43. The collimator magnet 43 serves as an ion lens and conducts an ion beam to the target substrate 31 in the form of a parallel beam. Between the second aperture plate 26 and the target substrate 31 is placed the ion measuring instrument 44 adapted to measure the number of ions impinging on the substrate. As the ion measuring instrument 44 use may be made of a faraday cup by way of example.

Figure 3:
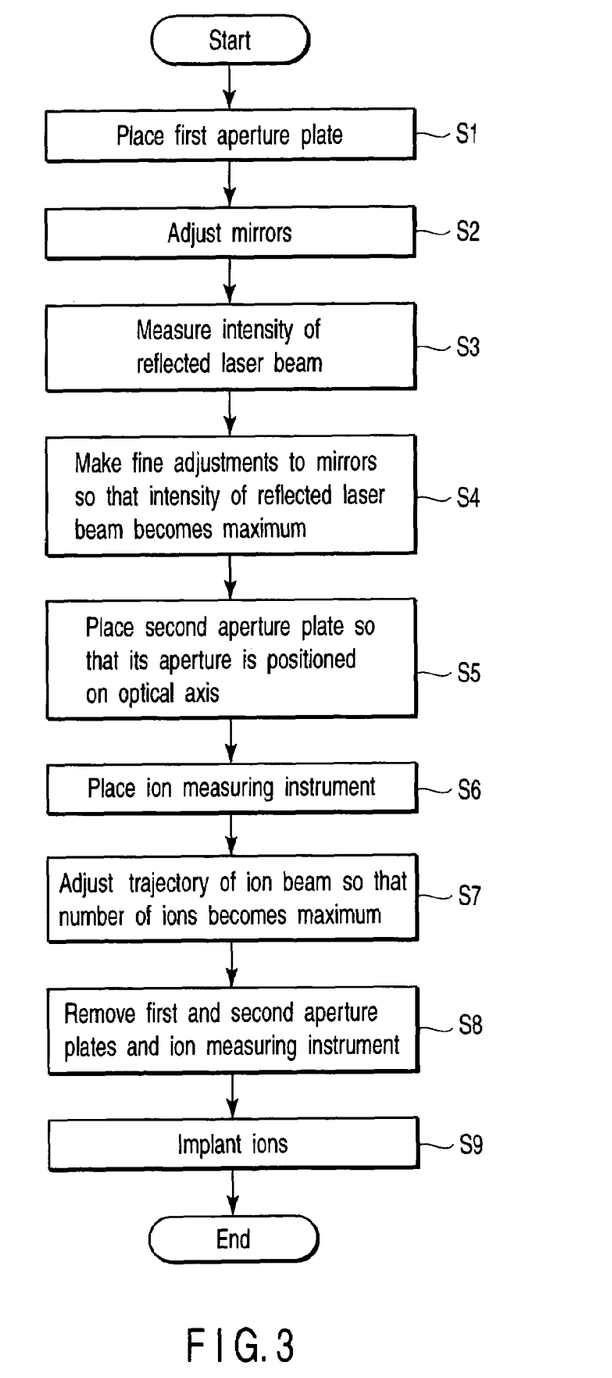
FIG. 3 is a flowchart illustrating an ion implantation method using the ion implantation apparatus according to the first embodiment of the present invention.

Next, a description is given of the method of ion implantation using the ion implantation apparatus 1 of the first embodiment with reference to FIGS. 1, 2 and 3. FIG. 3 is a flowchart illustrating a method of setting the perpendicularity of a beam of ions in the ion implantation apparatus of the first embodiment. First, an axis perpendicular to the target substrate 31 is set using light emitted from the laser beam source 12. The method of setting a line perpendicular to the target substrate 31 is described using FIGS. 1 and 2.

First, the first aperture plate 25 is placed over the target substrate 31 (step S1). Next, the controller 15 adjusts the inclination of each of the mirrors 13 and 14 so that light reflected by the mirrors 13 and 14 will pass through the aperture (first aperture) of the first aperture plate 25 (step S2). The laser beam conducted by the mirrors 13 and 14 is converted into circularly polarized light by the linearly polarized light component of P polarized light passing through the polarized beam splitter 21 and then the quarter-wave plate 23.

The circularly polarized light from the quarter-wave plate 23 passes through the aperture of the first aperture plate 25 and is then reflected by the target substrate 31. The reflected light passes through the aperture of the first aperture plate 25 again and then converted into linearly polarized light by the quarter-wave plate 23. The resulting linearly polarized light has its direction of polarization rotated through 90 degrees from the original direction of polarization (P polarized light to the polarized beam splitter 21) by the quarter-wave plate 23. That is, the reflected light is converted into S polarized light by the quarter-wave plate 23 and then reflected by the polarized beam splitter 21 into the light intensity measurer 22. The measurer 22 measures the intensity of the incident light and provides the measured value to the controller 15 (step S3).

The controller 15 adjusts the inclination of the mirrors 13 and 14 while observing the measured value from the light intensity measurer 22 so that the optical axis of the laser beam becomes perpendicular to the target substrate 31. That is, when the optical axis of light reflected by the mirror 14 is not perpendicular to the target substrate 31, then the intensity of the light decreases upon passing through the aperture of the first aperture plate 25 toward the target substrate 31. Further, when the light reflected by the target substrate 31 is not perpendicular to the substrate, then its intensity also decreases upon passing through the first aperture plate 25 toward the mirror 14. Thus, the light intensity measured by the light intensity measurer 22 becomes maximum when the optical axis of the laser beam is perpendicular to the target substrate 31. The controller 15 finely adjusts the inclination of the mirrors 13 and 14 so that the intensity of light incident on the light intensity measurer 22 becomes maximum (step S4).

The controller 15 next moves the second aperture plate 26 so that its aperture (second aperture) is positioned on the set optical axis. That is, the second aperture plate 26 is placed so that the light intensity detected by the light intensity measurer 22 will not decrease (step S5). The line perpendicular to the target substrate 31 is defined through the apertures of the first aperture plate 25 and the second aperture plate 26 placed in the above manner.

Next, the trajectory of the beam of ions is adjusted so that it coincides with the defined perpendicular line. A method of adjusting the trajectory of the ion beam will be described below with reference to FIGS. 2 and 3.

As shown in FIGS. 2 and 3, the ion measuring instrument 44 is placed between the second aperture plate 26 and the target substrate 31 (step S6). The controller 15 then controls the ion beam irradiation unit 41 so that a beam of ions passes through each of the apertures of the first aperture plate 25 and the second aperture plate 26. The ion measurement instrument 44 measures the number of incident ions and provides the measured value to the controller 15. With reference to this measured value, the controller 15 finely adjusts the axis of the ion beam from the collimator magnet 43 so that the number of ions measured by the ion measuring instrument 43 becomes maximum (step S7). In this state, the angle of the trajectory of the ion beam with respect to the target substrate 31 is identical to the angle of the optical axis of laser beam with respect to the substrate. After that, the first aperture plate 25 and the second aperture plate 26 and the ion measuring instrument 44 are removed (step S8) and then ions are implanted in the target substrate 31 (step S9).

According to the ion implantation apparatus of the first embodiment of the present invention, a virtual reference line that coincides with the optical axis of laser beam emitted to the target substrate 31 is defined by the definition unit 24 and a beam of ions is emitted so that its trajectory coincides with the virtual reference line. Thus, since the actual trajectory of the ion beam is controlled, ions can be implanted at an arbitrary angle into the target substrate 31. That is, since the angle at which ions are implanted does not depend on the mechanical precision of the ion implantation apparatus, the characteristics of semiconductor devices fabricated using ion implantation apparatuses does not vary from apparatus to apparatus. In addition, when the same ion implantation apparatus is used to process some substrates, the trajectory of the ion beam for each substrate is adjusted, therefore the characteristics of semiconductor devices does not vary from substrate to substrate.

[Second Embodiment]

A second embodiment of the present invention will be described below. In the second embodiment, the angle of the optical axis of laser beam relative to the target substrate for setting the reference line is adjusted by adjusting a substrate holding unit which holds the target substrate.

Figure 4:
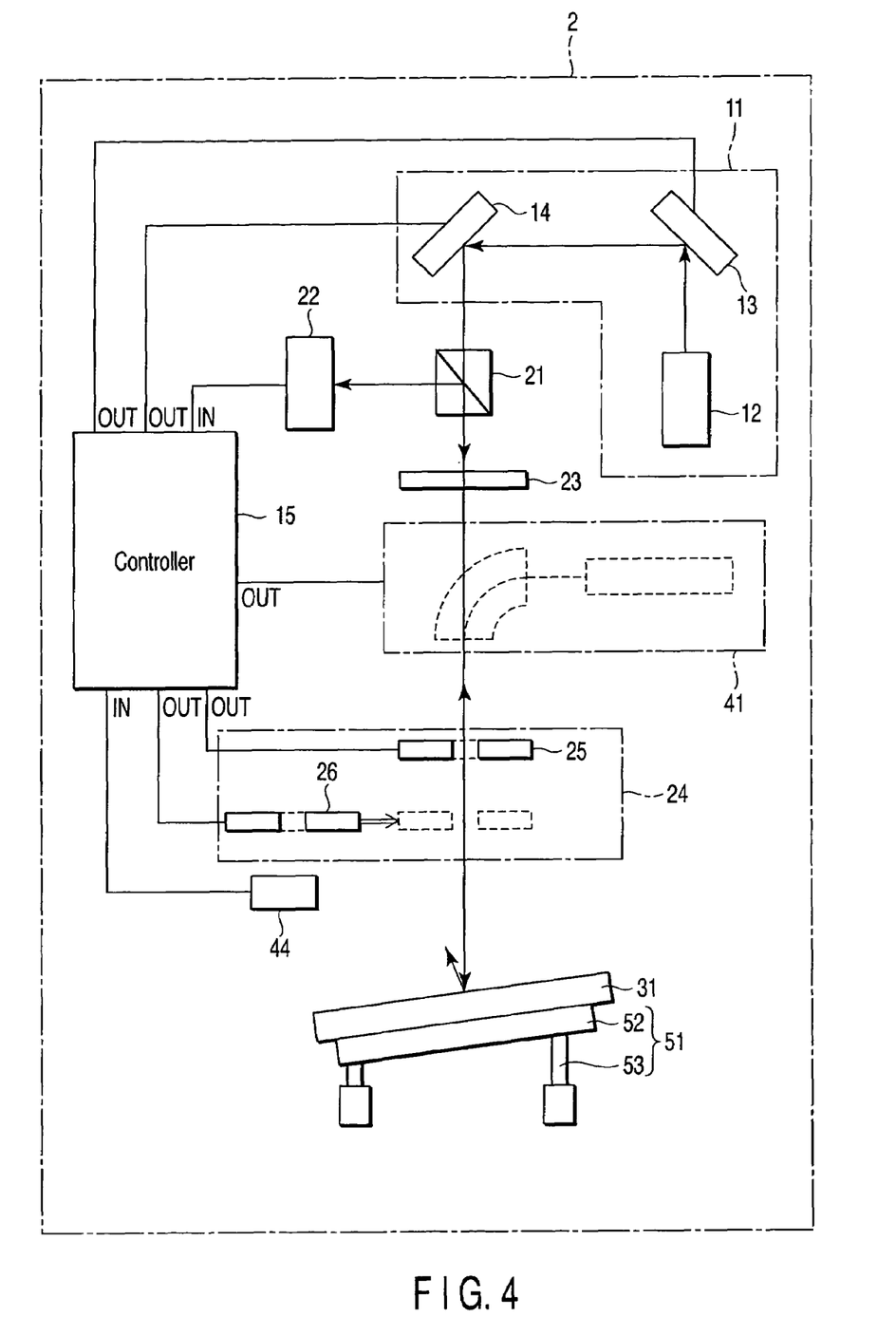
FIG. 4 shows one state of the main portion of an ion implantation apparatus according to a second embodiment of the present invention.

FIG. 4 schematically shows one state of the main portion of an ion implantation apparatus, indicated generally by 2, according to the second embodiment of the present invention. More specifically, FIG. 4 shows the state when a line perpendicular to the target substrate 31 is set. As shown in FIG. 4, the ion implantation apparatus 2 has a substrate holding unit (platen) 51. The substrate holding unit 51 is configured to be able to hold the target substrate 31 and adjust the angle (inclination) of its surface, and has an electrostatic chuck 52 and actuators 53. By changing the length of each of the legs of the actuators 53 which are connected to the electrostatic chuck, the angle of the surface of the target substrate 31 can be changed. The operation of the substrate holding unit 51 is controlled by the controller 15. The other arrangement is the same as in the first embodiment.

Figure 5:
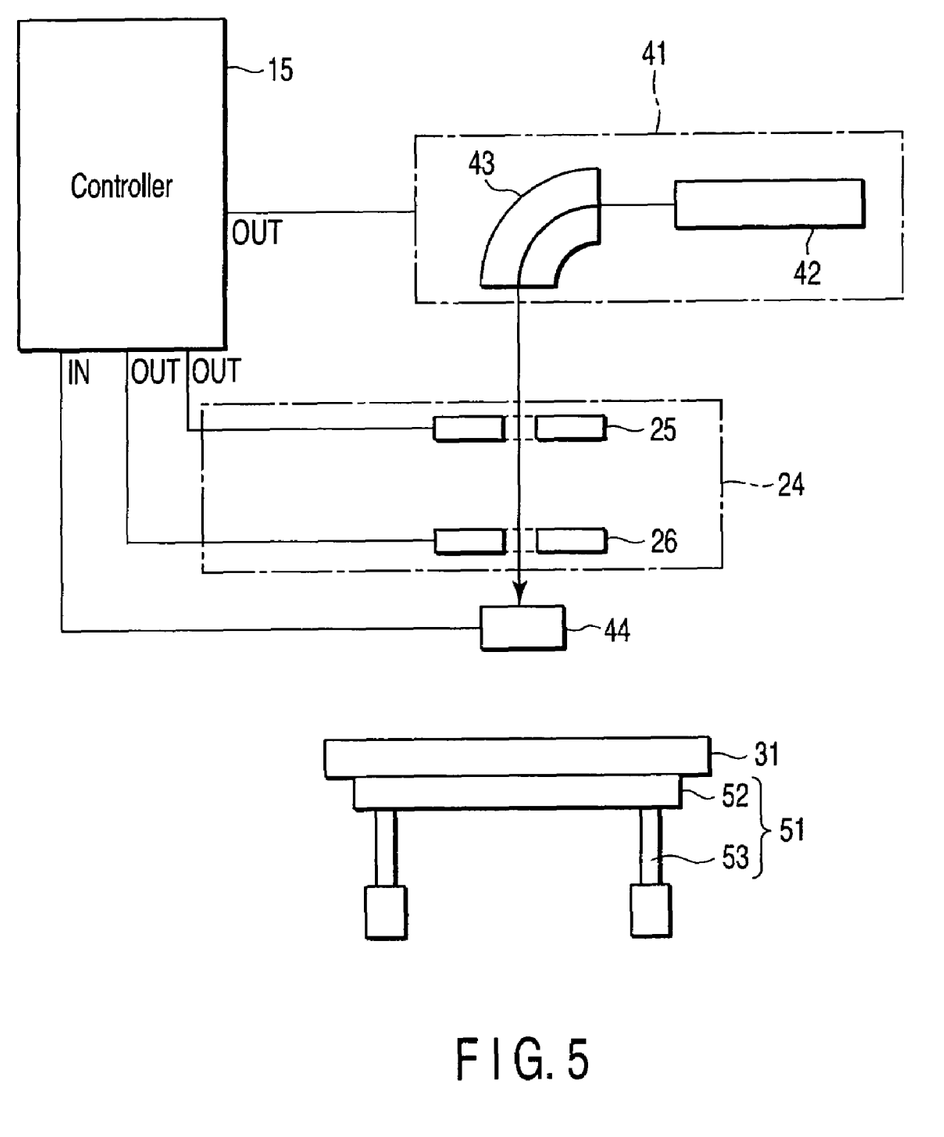
FIG. 5 shows one state of the main portion of the ion implantation apparatus according to the second embodiment of the present invention.

FIG. 5 shows one state of the main portion of the ion implantation apparatus according to the second embodiment. More specifically, FIG. 5 shows the state when the trajectory of an ion beam is adjusted. The arrangement shown in FIG. 5 remains unchanged from the arrangement of the first embodiment shown in FIG. 2 except that the target substrate 31 is held by the substrate holding unit 51.

Figure 6:
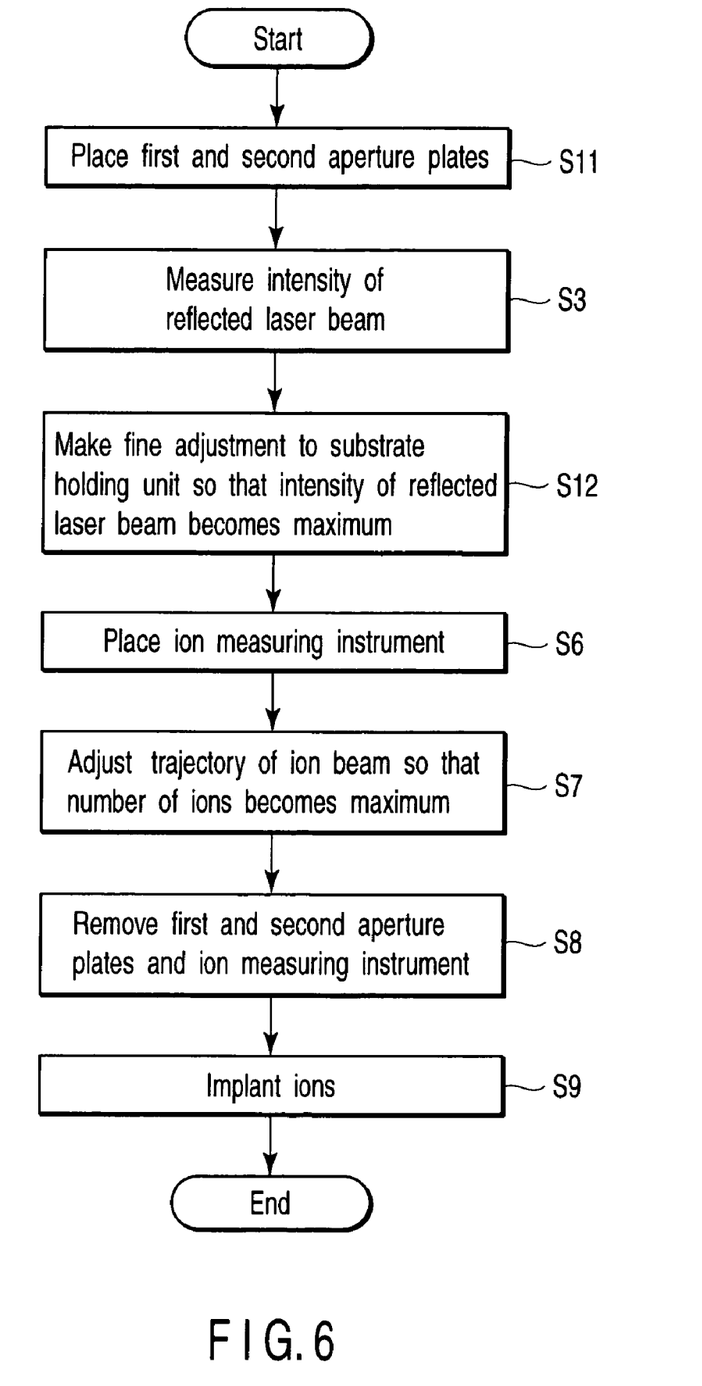
FIG. 6 is a flowchart illustrating an ion implantation method using the ion implantation apparatus according to the second embodiment of the present invention.

A method of ion implantation based on the ion implantation apparatus 2 of the second embodiment will be described next with reference to FIGS. 4, 5, and 6. FIG. 6 is a flowchart illustrating a method of setting the perpendicularity of the ion beam in the ion implantation apparatus of the second embodiment. First, an axis perpendicular to the target substrate 31 is set using light emitted from the laser beam source 12. With reference to FIGS. 4 and 6, the method of setting the line perpendicular to the target substrate 31 is described.

First, as shown in FIGS. 4 and 6, the first aperture plate 25 and the second aperture plate 26 are placed so that their respective apertures are positioned on the optical axis of the laser beam (step S11). After that, it is not particularly needed to make fine adjustments to the positions of the first aperture plate 25 and the second aperture plate 26 and the optical axis of the laser beam. Next, as in the first embodiment, the light intensity measuring unit 22 measures the intensity of light, which is emitted from the laser beam irradiation unit 11, passes through the first aperture of the first aperture plate 25 and the second aperture of the second aperture plate 26, is reflected by the target substrate 31, passes through the second and first apertures again, and is reflected by the polarized beam splitter 21 (step S3). While observing the measured light intensity, the controller 15 controls the substrate holding unit 51 to finely adjust the inclination of the surface of the target substrate 31 so that the light intensity becomes maximum (step S12). When the reflected light intensity becomes maximum, the optical axis of each of the reflected light from the target substrate 31 and the laser beam from the laser beam irradiation unit 11 is perpendicular to the substrate 31. In this state, therefore, the surface of the target substrate and the reference line defined by the first aperture and the second aperture are perpendicular to each other.

The subsequent steps are the same as in the first embodiment. That is, as shown in FIGS. 5 and 6, the ion measuring instrument 44 is placed between the second aperture plate 26 and the target substrate 31 (step S6). Next, the trajectory of the ion beam from the ion irradiation unit 41 is adjusted so that the value measured by the ion measuring instrument 44 becomes maximum (step S7). After that, the first aperture plate 25 and the second aperture plate 26 and the ion measuring instrument 44 are removed (step S8) and then ions are implanted into the target substrate 31 (step S9).

According to the second embodiment, as in the first embodiment, a reference line to the target substrate 31 is defined by the reference line defining unit 24 and a beam of ions is directed onto the substrate so that its trajectory coincides with the reference line. For this reason, the same advantages as in the first embodiment are obtained.

Moreover, in the second embodiment, the angle between the reference line and the surface of the substrate is adjusted by adjusting the inclination of the surface of the target substrate 31 with the substrate holding unit 51. For this reason, the second embodiment can increase the speed at which the reference line is set in comparison with the first embodiment in which the angle between the reference line and the surface of the substrate is adjusted by controlling the mirrors 13 and 14.

[Third Embodiment]

Figure 7:
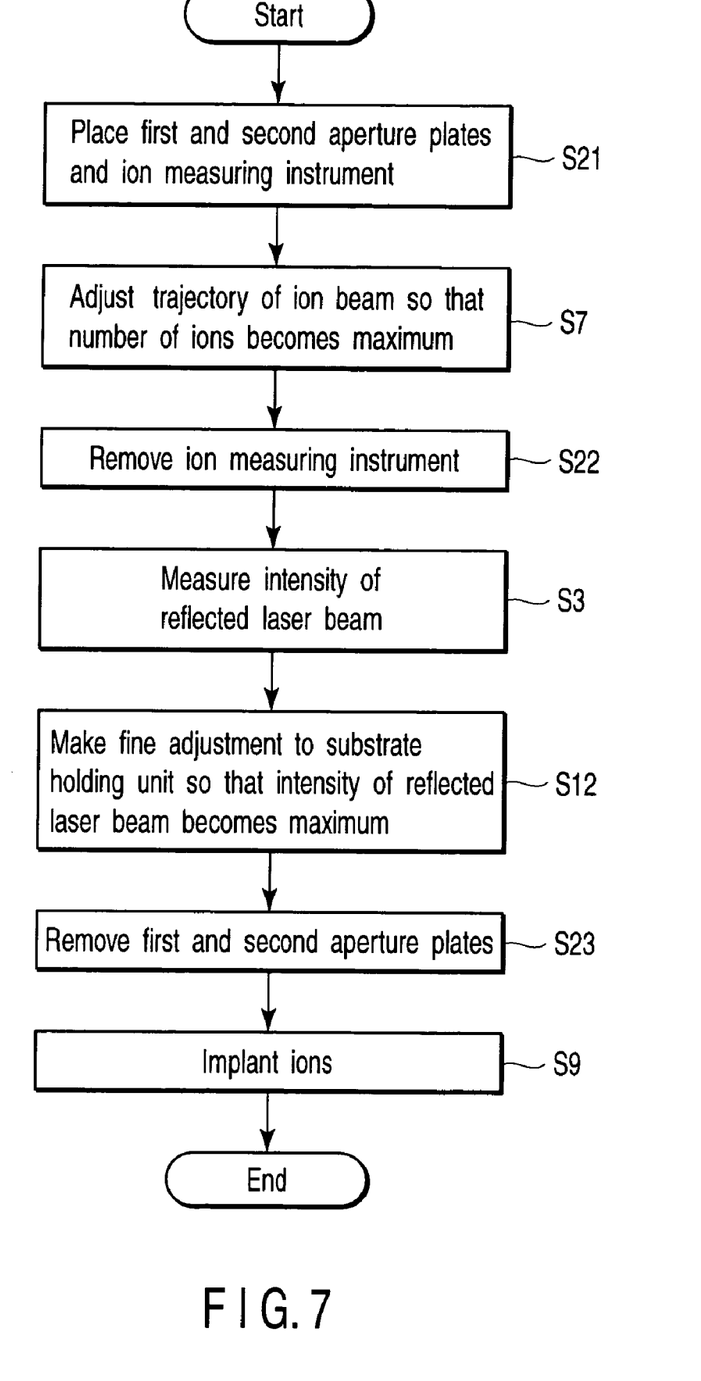
FIG. 7 is a flowchart illustrating an ion implantation method according to a third embodiment of the present invention.

A third embodiment of the present invention relates to a modification of the method of setting the perpendicularity of an ion beam using the ion implantation apparatus 2 of the second embodiment. In the third embodiment, the angle between the ion beam and the target substrate 31 is adjusted by adjusting the inclination of the surface of the target substrate using laser beam and the substrate holding unit 51 after the trajectory of the ion beam has been adjusted.

With reference to FIGS. 4, 5 and 7, the ion implantation method according to the third embodiment will be described. FIG. 7 is a flowchart illustrating the ion implantation method using the ion implantation apparatus 2 in accordance with the third embodiment. First, the trajectory of the ion beam is set. That is, as shown in FIGS. 5 and 7, the first aperture plate 25 and the second aperture plate 26 and the ion measuring instrument 44 are placed between the ion irradiation unit 41 and the position where the target substrate 31 is to be placed (step S21). Next, the trajectory of the ion beam is adjusted so that the value of the ion beam that passes through the first aperture of the first aperture plate 25 and the second aperture of the second aperture plate 26 and arrives at the ion measuring unit 44 becomes maximum (step S7). Next, the ion measuring instrument is removed (step S22).

Next, the angle between the previously set ion beam trajectory (the set trajectory) and the target substrate 31 is controlled. That is, as shown in FIGS. 4 and 7, as in the first and second embodiments, the light intensity measuring unit 22 measures the intensity of light, which is emitted from the laser beam irradiation unit 11, passes through the first aperture of the first aperture plate 25 and the second aperture of the second aperture plate 26, is reflected by the target substrate 31, passes through the second aperture and the first aperture again, and is reflected by the polarized beam splitter 21 (step S3). While observing the measured light intensity, the controller 15 controls the substrate holding unit 51 to finely adjust the inclination of the surface of the target substrate 31 so that the light intensity becomes maximum (step S12). When the reflected light intensity becomes maximum, the target substrate 31 is perpendicular to the optical axis of the laser beam. In this state, therefore, the surface of the target substrate 31 and the reference line defined by the first aperture and the second aperture are perpendicular to each other. That is, the surface of the target substrate 31 and the trajectory of the ion beam are perpendicular to each other.

Next, the first aperture plate 25 and the second aperture plate 26 are removed (step S23). Finally, ions are implanted into the target substrate 31 along the previously set trajectory (step S9).

According to the ion implantation method of the third embodiment, as in the first embodiment, a reference line to the target substrate 31 is defined by the reference line defining unit 24 and a beam of ions is directed onto the substrate so that its trajectory coincides with the reference line. For this reason, the same advantages as in the first embodiment are obtained.

Moreover, in the third embodiment, as in the second embodiment, the angle between the reference line and the surface of the substrate is adjusted by adjusting the inclination of the surface of the target substrate 31 with the substrate holding unit 51. For this reason, the third embodiment can provide the same advantages as the second embodiment.

Furthermore, according to the third embodiment, the angle between the ion beam and the target substrate 31 is adjusted by adjusting the inclination of the surface of the target substrate using the substrate holding unit 51 after the trajectory of the ion beam has been adjusted. For this reason, in implanting ions into two or more target substrates, the speed at which the angle of the surface of the target substrate relative to the ion beam is adjusted for each substrate is increased.

In the first, second and third embodiments, the first aperture plate 25 and the second aperture plate 26 may be configured such that their aperture size is made variable, like an iris. Variable aperture size allows fine adjustments of the optical axis of laser beam and the trajectory of an ion beam to be made with ease.

In the first, second and third embodiments, the polarized beam splitter 21 is used in order to prevent laser beam reflected by the target substrate 31 from damaging the laser beam source 12. It is also possible to use another arrangement in order to prevent laser beam from being reflected back to the laser beam source 12. Additionally, if the laser beam source 12 itself has means for preventing reflected laser beam from entering it, there is no need to be concerned about the influence of reflected laser beam on the laser beam source.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ion implantation apparatus comprising:
   a laser beam irradiation unit irradiating a surface of a target substrate with laser beam, an angle of an optical axis of the laser beam relative to the surface being adjustable;
   a reference line defining unit adapted to define a virtual reference line coinciding with the optical axis of the laser beam when the angle takes a certain value; and
   an ion irradiation unit providing an ion beam on a trajectory coinciding with the reference line.

2. The apparatus according to claim 1, wherein the reference line defining unit includes
   a first aperture plate provided between the laser beam irradiation unit and the surface and having a first aperture, and
   a second aperture plate provided between the first aperture plate and the surface and having a second aperture.

3. The apparatus according to claim 2, further comprising
   a light intensity measuring unit measuring an intensity of laser beam passing through the first aperture toward the surface, reflected by the surface, and passing through the first aperture again, and a controller controlling the laser beam irradiation unit to adjust the angle so that the intensity becomes maximum.

4. The apparatus according to claim 2, further comprising a substrate holding unit holding the target substrate and changing an inclination of the surface to change the angle, a laser beam intensity measuring unit measuring the intensity of laser beam passing through the first aperture and the second aperture toward the surface, then reflected by the surface, and passing through the second aperture and the first aperture again, and a controller controlling the substrate holding unit so that the surface has an inclination at which the intensity is maximum.

5. An ion implantation apparatus comprising:

an ion irradiation unit irradiating a surface of a target substrate with an ion beam, an angle of a trajectory of the ion beam relative to the surface being adjustable;

a reference line defining unit adapted to define a virtual reference line coinciding with the trajectory of the ion beam when the angle takes a certain value; and a substrate holding unit holding the target substrate and changing an inclination of the surface relative to the reference line to change the angle.

6. The apparatus according to claim 5, wherein the reference line defining unit includes a first aperture plate provided between the ion irradiation unit and the surface and having a first aperture, and a second aperture plate provided between the first aperture plate and the surface and having a second aperture.

7. The apparatus according to claim 6, further comprising a laser beam irradiation unit irradiating the surface with laser beam, a light intensity measuring unit measuring an intensity of laser beam passing through the first aperture and the second aperture toward the surface, then reflected by the surface, and passing through the second aperture and the first aperture again, and a controller controlling the substrate holding unit so that the surface has an inclination at which the intensity is maximum.

8. An ion implantation method comprising:

defining a virtual reference line coinciding with an optical axis of laser beam directed onto a surface of a target substrate when an angle of the optical axis relative to the surface is a certain value; and irradiating the surface with an ion beam on a trajectory which coincides with the defined reference line.

9. The method according to claim 8, wherein said defining a reference line includes defining the optical axis by means of a first aperture plate having a first aperture positioned on the optical axis and a second aperture plate having a second aperture positioned on the optical axis, and said irradiating the surface with an ion beam includes emitting the ion beam so that the ion beam passes through the first aperture and the second aperture.

10. The method according to claim 9, wherein said defining a reference line includes measuring an intensity of laser beam passing through the first aperture toward the surface, then reflected by the surface, and passing through the first aperture again, controlling a laser beam irradiation unit to adjust the angle so that the intensity becomes maximum, and placing the second aperture plate so that the second aperture is positioned on the optical axis.

11. The method according to claim 9, wherein said defining the reference line includes measuring an intensity of laser beam passing through the first aperture and the second aperture toward the surface, then reflected by the surface, and passing through the second aperture and the first aperture again, and controlling a substrate holding unit holding the target substrate to change an inclination of the surface so that the intensity becomes maximum.

12. An ion implantation method comprising:

defining a virtual reference line, the reference line coinciding with a set trajectory of an ion beam emitted toward a virtual plane when an angle of the ion beam relative to the virtual plane becomes a certain value, a surface of a target substrate being to be positioned at the virtual plane;

adjusting an angle of the surface relative to an optical axis of laser beam the trajectory of which coincides with the defined reference line; and irradiating the adjusted surface with the ion beam on the set trajectory.

13. The method according to claim 12, wherein said defining a reference line includes defining the set trajectory by means of a first aperture plate having a first aperture positioned on the set trajectory and a second aperture plate having a second aperture positioned on the set trajectory, and the optical axis passes through the first aperture and the second aperture.

14. The method according to claim 13, wherein said adjusting an angle of the surface includes measuring an intensity of laser beam passing through the first aperture and the second aperture toward the surface, then reflected by the surface, and passing through the second aperture and the first aperture again, and controlling a substrate holding unit holding the target substrate to change an inclination of the surface so that the intensity becomes maximum.

* * * * *

UNITED STATES PATENT AND TRADEMARK OFFICE
CERTIFICATE OF CORRECTION

PATENT NO. : 7,119,347 B2  Page 1 of 1
APPLICATION NO. : 11/088881
DATED : October 10, 2006
INVENTOR(S) : Shibata It is certified that error appears in the above-identified patent and that said Letters Patent is hereby corrected as shown below:

Column 10, line 28, change "being to be positioned" to --being positioned--.

Signed and Sealed this

Thirteenth Day of February, 2007

JON W. DUDAS
*Director of the United States Patent and Trademark Office*